United States Patent
Takuma

(10) Patent No.: US 12,166,343 B2
(45) Date of Patent: Dec. 10, 2024

(54) OVERCURRENT PROTECTION CIRCUIT

(71) Applicant: Rohm Co., Ltd., Kyoto (JP)

(72) Inventor: Toru Takuma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 213 days.

(21) Appl. No.: 17/785,172

(22) PCT Filed: Dec. 17, 2020

(86) PCT No.: PCT/JP2020/047163
§ 371 (c)(1),
(2) Date: Jun. 14, 2022

(87) PCT Pub. No.: WO2021/125269
PCT Pub. Date: Jun. 24, 2021

(65) Prior Publication Data
US 2023/0026059 A1     Jan. 26, 2023

(30) Foreign Application Priority Data

Dec. 20, 2019 (JP) .................................. 2019-230705

(51) Int. Cl.
*H02H 7/22*     (2006.01)
(52) U.S. Cl.
CPC ..................... *H02H 7/22* (2013.01)
(58) Field of Classification Search
CPC ............. H02H 7/22; H03K 2017/0806; H03K 17/0822
USPC .......................................................... 361/86
See application file for complete search history.

(56) References Cited

U.S. PATENT DOCUMENTS

| 2019/0123541 A1 | 4/2019 | Takuma et al. |
| 2020/0403393 A1 | 12/2020 | Takuma et al. |
| 2022/0037872 A1 | 2/2022 | Takuma et al. |

FOREIGN PATENT DOCUMENTS

| JP | 2002-344296 | | 11/2002 | |
| JP | 2002344296 A | * | 11/2002 | |
| JP | 2004-248452 | | 9/2004 | |
| JP | 2004248452 A | * | 9/2004 | |
| WO | WO-2013171251 A1 | * | 11/2013 | ............. H02H 3/087 |
| WO | WO 2017/187785 | | 12/2018 | |

OTHER PUBLICATIONS

International Search Report in International Appln. No. PCT/JP2020/047163, dated Mar. 9, 2021, 5 pages (with English Translation).

* cited by examiner

*Primary Examiner* — Thienvu V Tran
*Assistant Examiner* — Sreeya Sreevatsa
(74) *Attorney, Agent, or Firm* — Fish & Richardson P.C.

(57) ABSTRACT

An overcurrent protection circuit includes a hiccup controller which is configured to hiccup-drive a switching element such that an on-period and an off-period alternate. The hiccup controller controls at least one of the on- and off-period according to a temperature sense signal. The temperature sense signal can be generated by detecting at least one of temperature of the switching element and a difference in temperature between the switching element and another element. When at least one of temperature of the switching element and the difference in temperature between the switching element and the other element is higher than a predetermined threshold value, the hiccup controller can reduce the on-period ton and increase the off-period.

8 Claims, 13 Drawing Sheets

OVERCURRENT PROTECTION CIRCUIT

CROSS REFERENCE OF RELATED APPLICATIONS

This application is a U.S. National Phase application under 35 U.S.C. § 371 of International Patent Application No. PCT/JP2020/047163, filed on Dec. 17, 2020, which claims the priority of Japanese Patent Application No. 2019-230705, filed on Dec. 20, 2019, the disclosure of which is incorporated herein by reference in its entirety.

TECHNICAL FIELD

The invention disclosed herein relates to an overcurrent protection circuit.

BACKGROUND ART

The applicant of this application has been proposing a number of new techniques (see, for example, Patent Document 1) related to switching devices such as vehicle-mounted IPDs (intelligent power devices).

LIST OF CITATIONS

Patent Literature

[Patent Document 1] WO/2017/187785

SUMMARY OF THE INVENTION

Problem to be Solved by the Invention

Conventional switching devices leave room for further improvement in terms of an overcurrent protection function.

In view of the above-mentioned problem encountered by the present inventor, an object of the present invention is to provide an overcurrent protection circuit with an enhanced safety.

Means for Solving the Problem

An overcurrent protection circuit according to what is disclosed herein includes a hiccup controller that, when an output current that passes through a switching element goes into an overcurrent state, hiccup-drives the switching element such that a predetermined on-period and a predetermined off-period alternate. The hiccup controller is configured to control at least one of the on-period and the off-period in accordance with a temperature sense signal.

Other features, elements, steps, benefits, and characteristics of the present invention will become clearer with reference to the following detailed description of preferred embodiments of the invention in conjunction with the accompanying drawings.

Advantageous Effects of the Invention

According to the invention disclosed herein, it is possible to provide an overcurrent protection circuit with an enhanced safety.

DESCRIPTION OF EMBODIMENTS

<Semiconductor Integrated Circuit Device>

Figure 1:
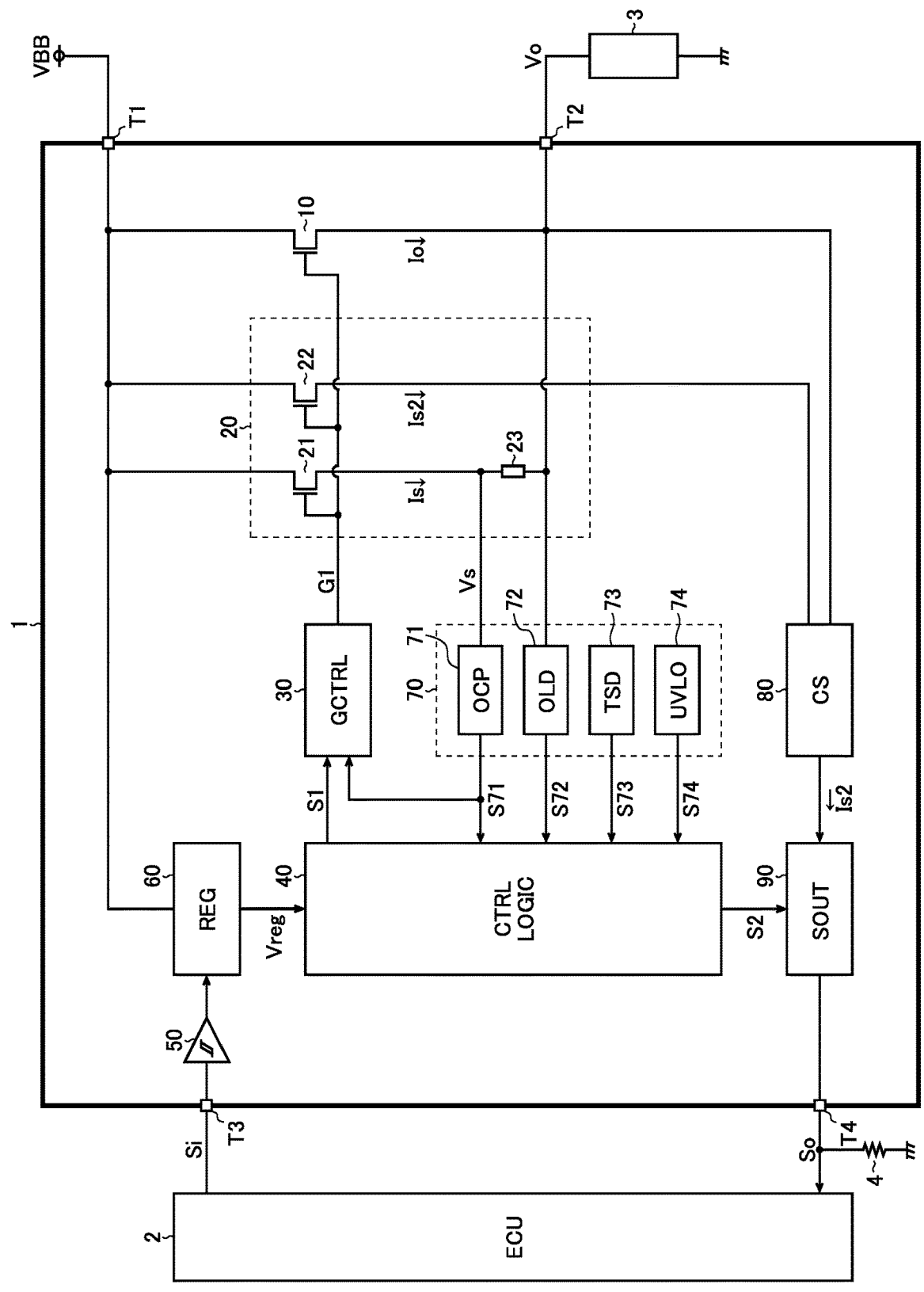
FIG. 1 is diagram showing an overall configuration of a semiconductor integrated circuit device.

FIG. 1 is diagram showing an overall configuration of a semiconductor integrated circuit device. The semiconductor integrated circuit device 1 of this embodiment is a high-side switch LSI (a kind of a vehicle-mounted IPD) for vehicle-mounted applications which switches between conducting and cut-off states a path between an application terminal for a supply voltage VBB and a load 3 in response to instructions from an ECU (electronic control unit) 2.

The semiconductor integrated circuit device 1 includes, as a means for establishing electrical connection with outside the device, external terminals T1 to T4. The external terminal T1 is a power terminal (VBB pin) for receiving a supply voltage VBB (for example, 12 V) from an unillustrated battery. The external terminal T2 is a load connection terminal or an output terminal (OUT pin) for connection with a load 3 (such as a bulb lamp, a relay coil, a solenoid, a light emitting diode, or a motor). The external terminal T3 is a signal input terminal (IN pin) for receiving external input of an external control signal Si from the ECU 2. The external terminal T4 is a signal output terminal (SENSE pin) for external output of a status notification signal So to the ECU 2. An external sense resistor 4 is externally connected between the external terminal T4 and the grounded terminal.

The semiconductor integrated circuit device 1 is constituted by integrating together an NMOSFET 10, an output current monitor 20, a gate controller 30, a control logic circuit 40, a signal input circuit 50, an internal power source 60, a fault protector 70, an output current detector 80, and a signal output circuit 90.

The NMOSFET 10 is a power transistor with a high withstand voltage (for example, with a withstand voltage of 42 V) of which the drain is connected to the external terminal T1 and the source is connected to the external terminal T2. So connected, the NMOSFET 10 functions as a switching element (a high-side switch) for switching a current path leading from the application terminal for the supply voltage VBB via the load 3 to the grounded terminal between conducting and cut-off states. The NMOSFET 10 is on when a gate driving signal G1 is at high level, and is off when the gate driving signal G1 is at low level.

The NMOSFET 10 can be designed to have an on-resistance Ron of several tens of ohms. However, the lower the on-resistance Ron of the NMOSFET 10 is, the more likely an overcurrent is to occur when a ground fault (short-circuit fault to a grounded terminal or a comparable low-potential terminal) occurs at the external terminal T2, and thus the more likely excessive heat is to be produced. Thus, the lower the on-resistance Ron of the NMOSFET 10 is, the more significant an overcurrent protection circuit 71 and a temperature protection circuit 73, which will be described later, are.

The output current monitor 20 includes NMOSFETs 21 and 22 along with a sense resistor 23 and generates a sense voltage Vs (corresponding to a sense signal) in accordance with an output current Io that passes through the NMOSFET 10.

The NMOSFETs 21 and 22 are both mirror transistors connected in parallel with the NMOSFET 10 and generate sense currents Is and Is2 in accordance with the output current Io. The size ratio of the NMOSFET 10 to the NMOSFETs 21 and 22 is m:1 (where, m>1). Thus, the sense currents Is and Is2 have 1/m (one mth) the magnitude of the output current Io. The NMOSFETs 21 and 22, like the NMOSFET 10, is on when the gate driving signal G1 is at high level, and is off when the gate driving signal G1 is at low level.

The sense resistor 23 (with a resistance value Rs) is connected between the source of the NMOSFET 21 and the external terminal T2 and is a current-voltage conversion element that generates the sense voltage Vs(=Is×Rs+Vo, where Vo is the output voltage appearing at the external terminal T2) in accordance with the sense current Is.

The gate controller 30 generates, by increasing the current capability of a gate control signal S1, the gate driving signal G1 to output it to the gate of the NMOSFET 10 (as well as to the gates of the NMOSFETs 21 and 22); the gate controller 30 thereby performs on/off control of the NMOSFET 10. The gate controller 30 has a function of controlling the NMOSFET 10 such that the output current Io is limited in accordance with an overcurrent protection signal S71.

The control logic circuit 40 is supplied with an internal supply voltage Vreg to generate the gate control signal S1. For example, when the external control signal Si is at high level (the logic level that keeps the NMOSFET 10 on), the internal supply voltage Vreg is supplied from the internal power source 60; thus the control logic circuit 40 is in an operating state, and the gate control signal Si is at high level(=Vreg). On the other hand, when the external control signal Si is at low level (the logic level that keeps the NMOSFET 10 off), the internal supply voltage Vreg is not supplied from the internal power source 60; thus the control logic circuit 40 is in a non-operating state, and the gate control signal S1 is at low level(=GND). The control logic circuit 40 monitors various fault protection signals (the overcurrent protection signal S71, an open protection signal S72, a temperature protection signal S73, and an undervoltage protection signal S74). The control logic circuit 40 also has a function of generating an output switch signal S2 in accordance with the results of monitoring of, out of the fault protection signals mentioned above, the overcurrent protection signal S71, the open protection signal S72, and the temperature protection signal S73.

The signal input circuit 50 is a Schmitt trigger that receives from the external terminal T3 the external control signal Si and that transmits it to the control logic circuit 40 and to the internal power source 60. The external control signal Si, for example, turns to high level when the NMOSFET 10 is turned on and turns to low level when the NMOSFET 10 is turned off.

The internal power source 60 generates from the supply voltage VBB a predetermined internal supply voltage Vreg and supplies it to different parts of the semiconductor integrated circuit device 1. Whether or not to operate the internal power source 60 is controlled in accordance with the external control signal Si. More specifically, the internal power source 60 is in an operating state when the external control signal Si is at high level and is in a non-operating state when the external control signal Si is at low level.

The fault protector 70 is a circuit block for detecting various kinds of faults in the semiconductor integrated circuit device 1 and includes an overcurrent protection circuit 71, an open protection circuit 72, a temperature protection circuit 73, and an undervoltage protection circuit 74.

The overcurrent protection circuit 71 generates the overcurrent protection signal S71 in accordance with the result of monitoring of the sense voltage Vs (that is, whether an overcurrent fault is occurring with respect to the output current Io). The overcurrent protection signal S71 is, for example, at low level when no fault is being detected and is at high level when a fault is being detected.

The open protection circuit 72 generates the open protection signal S72 in accordance with the result of monitoring of the output voltage Vo (that is, whether an open fault is occurring with respect to the load 3). The open protection signal S72 is, for example, at low level when no fault is being detected and is at high level when a fault is being detected.

The temperature protection circuit 73 includes a temperature sensing element (unillustrated) for detecting overheating of the semiconductor integrated circuit device 1 (especially around the NMOSFET 10) and generates the temperature protection signal S73 in accordance with the result of the detection (that is, whether overheating is occurring). The temperature protection signal S73 is, for example, at low level when no fault is being detected and is at high level when a fault is being detected.

The undervoltage protection circuit 74 generates the undervoltage protection signal S74 in accordance with the result of monitoring of the supply voltage VBB or the internal supply voltage Vreg (that is, whether an undervoltage fault is occurring). The undervoltage protection signal S74 is, for example, at low level when no fault is being detected and is at high level when a fault is being detected.

The output current detector 80 makes the source voltage of the NMOSFET 22 equal to the output voltage Vo using an unillustrated biasing means, and thereby generates, in accordance with the output current Io, the sense current Is2(=Io/m) to output it to the signal output circuit 90.

The signal output circuit 90, based on the output selection signal S2, selectively outputs to the external terminal T4 either the sense current Is2 (corresponding to the result of sensing of the output current Io) and the constant voltage V90 (corresponding to a fault flag, unillustrated in FIG. 1). When the sense current Is2 is selectively output, an output detecting voltage V80(=Is2×R4) obtained by submitting the sense current Is2 to current-to-voltage conversion by the external sense resistor 4 (with a resistance value R4) is transmitted as the status notification signal So to the ECU 2. The higher the output current Io, the higher the output detecting voltage V80, and the lower the output current Io, the lower the output detecting voltage V80. On the other hand, when the constant voltage V90 is selectively output, as the status notification signal So, the constant voltage V90 is transmitted to the ECU 2. When the current value of the output current Io is read from the status notification signal So, the status notification signal So can be subjected to A/D (analog-to-digital) conversion. On the other hand, when the fault flag is read from the status notification signal So, the logical level of the status notification signal So can be checked against a threshold value slightly lower than the constant voltage V90.

<Gate Controller>

Figure 2:
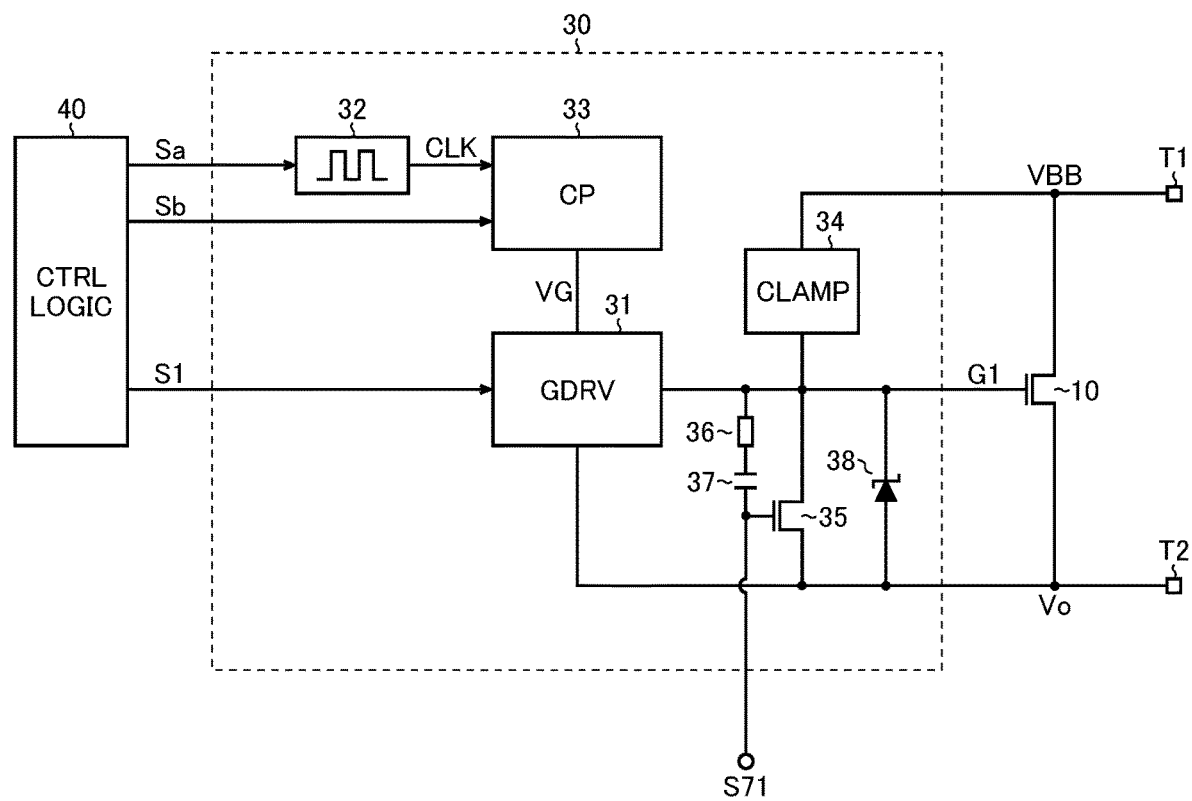
FIG. 2 is a diagram showing one configuration example of a gate controller.

FIG. 2 is a diagram showing one configuration example of the gate controller 30. The gate controller 30 of this configuration example includes a gate driver 31, an oscillator 32, a charge pump 33, a clamper 34, an NMOSFET 35, a resistor 36 (with a resistance value R36), a capacitor 37 (with a capacitance value C37), and a Zener diode 38.

The gate driver 31 is connected between the output terminal of the charge pump 33 (that is, an application terminal for a boosted voltage VG) and the external terminal T2 (that is, an application terminal for the output voltage Vo) and generates the gate driving signal G1 by increasing the current capability of the gate control signal S1. Here, the gate driving signal G1 is at high level(=VG) when the gate control signal S1 is at high level, and is at low level(=Vo) when the gate control signal S1 is at low level.

The oscillator 32 generates a clock signal CLK of a predetermined frequency to feed it to the charge pump 33. Whether or not to operate the oscillator 32 is controlled in accordance with an enable signal Sa from the control logic circuit 40.

The charge pump 33 is one example of a voltage booster which, by driving a flying capacitor using the clock signal CLK, generates a boosted voltage VG higher than the supply voltage VBB to supply the boosted voltage VG to the gate driver 31. Whether or not to operate the charge pump 33 is controlled in accordance with an enable signal Sb from the control logic circuit 40.

The clamper 34 is connected between the external terminal T1 (that is, the application terminal for the supply voltage VBB) and the gate of the NMOSFET 10. In an application in which an inductive load 3 is connected to the external terminal T2, when the NMOSFET 10 is turned from on to off, due to a counter-electromotive force in the load 3, the output voltage Vo falls to a negative voltage(<GND). To cope with this, the clamper 34 (what is called an active clamp circuit) is provided for absorbing energy.

The drain of the NMOSFET 35 is connected to the gate of the NMOSFET 10. The source of the NMOSFET 35 is connected to the external terminal T2. The gate of the NMOSFET 35 is connected to an application terminal for the overcurrent protection signal S71. Between the drain and the gate of the NMOSFET 35, the resistor 36 and the capacitor 37 are connected in series.

The cathode of the Zener diode 38 is connected to the gate of the NMOSFET 10. The anode of the Zener diode 38 is connected to the source of the NMOSFET 10. So connected, the Zener diode 38 functions as a clamping element for limiting the gate-source voltage(=VG−Vo) of the NMOSFET 10 such that it remains equal to or lower than a predetermined value.

In the gate controller 30 of this configuration example, when the overcurrent protection signal S71 is raised to high level, the gate driving signal G1 is lowered, from high level(=VG) in steady operation, at a predetermined time constant τ(=R36×C37). As a result, the conductivity of the NMOSFET 10 gradually lowers to limit the output current Io. On the other hand, when the overcurrent protection signal S71 is dropped to low level, the gate driving signal G1 is raised at the predetermined time constant τ. As a result, the conductivity of the NMOSFET 10 gradually rises to cease to limit the output current Io.

In this way, the gate controller 30 of this configuration example has a function of controlling the gate driving signal G1 so as to limit the output current Io in accordance with the overcurrent protection signal S71.

<Discussion on Overcurrent Protection Operation>

In general, overcurrent protection operation can be classified into three types, namely (1) current limiting operation, (2) hiccup operation, and (3) off-latch operation.

Figure 3:
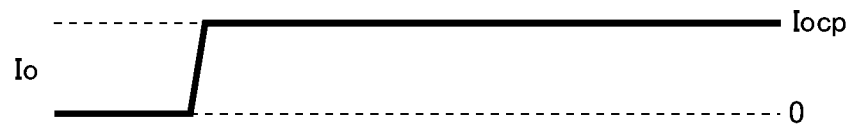
FIG. 3 is a diagram showing a first example (current limiting operation) of overcurrent protection operation.

FIG. 3 is a diagram showing a first example (current limiting operation) of overcurrent protection operation. As shown in FIG. 3, in current limiting operation, when the output current Io goes into an overcurrent state, the on-resistance Ron of the NMOSFET 10 is raised, and thereby the output current Io is limited to equal to or lower than a predetermined overcurrent limit value Iocp.

Figure 4:
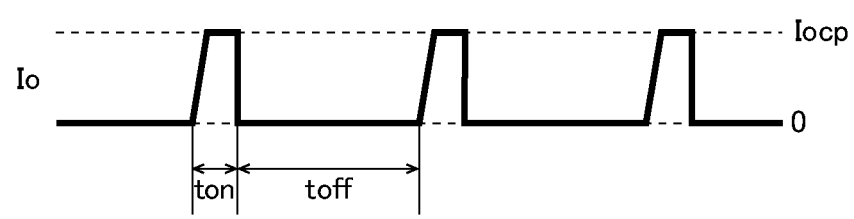
FIG. 4 is a diagram showing a second example (hiccup operation) of overcurrent protection operation.

FIG. 4 is a diagram showing a second example (hiccup operation) of overcurrent protection operation. As shown in FIG. 4, in hiccup operation, when the output current Io goes into an overcurrent state, the NMOSFET 10 is hiccup-driven (driven intermittently with on- and off-states switched periodically) such that a predetermined on-period ton and a predetermined off-period toff alternate. The hiccup operation is particularly effective when an inductive load 3 (such as a solenoid coil and a relay coil) is connected.

Figure 5:
FIG. 5 is a diagram showing a third example (off-latch operation) of overcurrent protection operation.

FIG. 5 is a diagram showing a third example (off-latch operation) of overcurrent protection operation. As shown in FIG. 5, in off-latch operation, when the output current Io goes into an overcurrent state, the NMOSFET 10 is forcibly turned off. Once the off-latch operation is performed, the NMOSFET 10 is kept off until the semiconductor integrated circuit device 1 is restarted.

Of the three types of the overcurrent protection operation described above, hiccup operation (FIG. 4), in which the output current Io is turned on and off periodically, compared to current limiting operation (FIG. 3), in which the output current Io continues to pass, is more effective in suppressing a rise in temperature in the semiconductor integrated circuit device 1 (NMOSFET 10 in particular) during overcurrent protection operation.

In particular, in the semiconductor integrated circuit device 1 which is assumed to be used in a principal part of a vehicle (such as an engine and a transmission which can become hot), hiccup operation described above is preferred so as to avoid overheating during overcurrent protection operation.

Inconveniently, in conventional hiccup operation, the on-period ton and off-period toff of the NMOSFET 10 are fixed beforehand. Thus, depending on the on-resistance Ron of the NMOSFET 10 and the thermal resistance of the package, there is a risk of an overheated state occurring even in hiccup operation.

In view of what has been discussed above, the following description proposes an overcurrent protection circuit 71 that can improve safety (suppress a rise the temperature) during hiccup operation.

<Overcurrent Protection Circuit>

Figure 6:
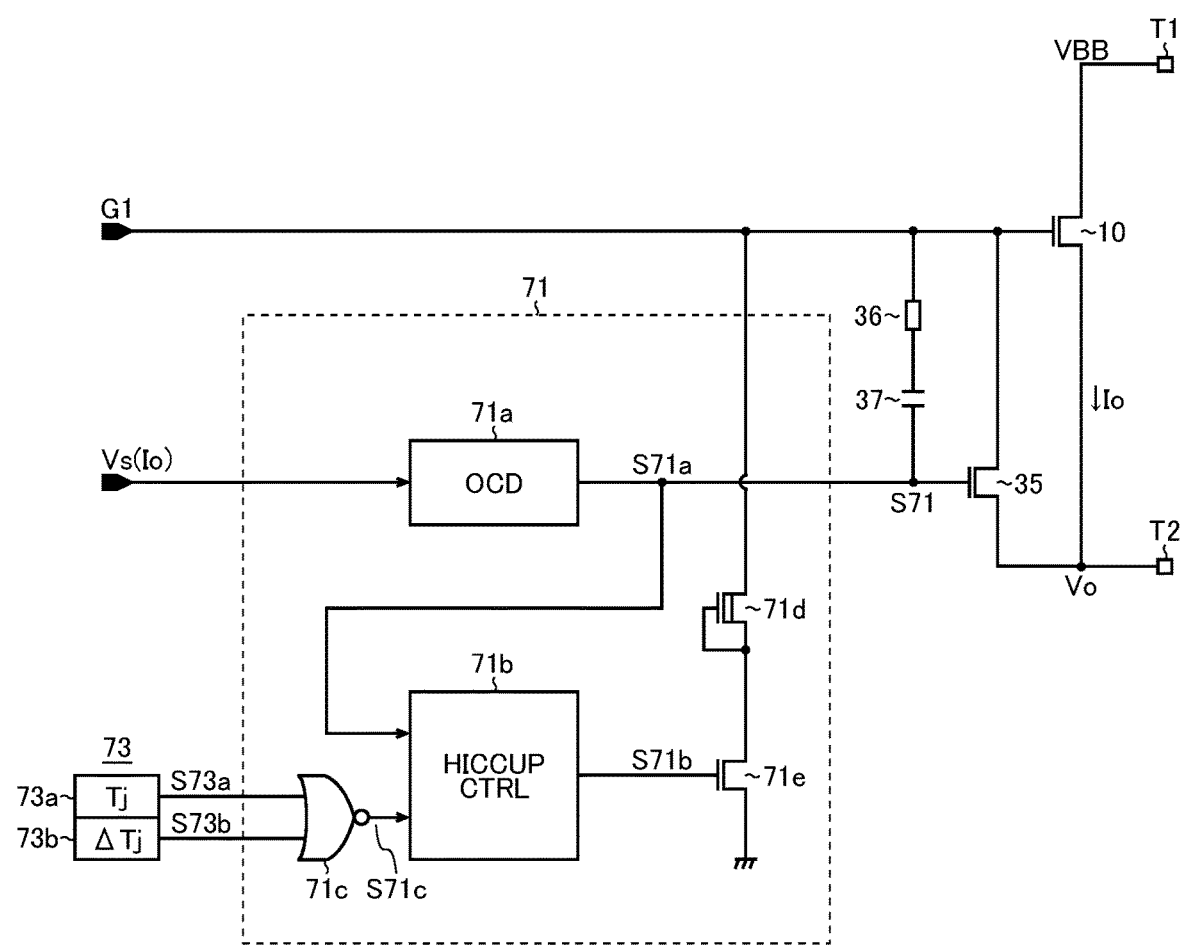
FIG. 6 is a diagram showing one configuration example of an overcurrent protection circuit.

FIG. 6 is a diagram showing one configuration example of the overcurrent protection circuit 71. The overcurrent protection circuit 71 of this configuration example includes an overcurrent sensor 71a, a hiccup controller 71b, a NOR gate 71c, and NMOSFETs 71d and 71e.

The overcurrent sensor 71a monitors a sense voltage Vs (and hence the output current Io) to generate an overcurrent sense signal S71a. The overcurrent sense signal S71a is, for example, at high level when an overcurrent is being detected (Io>Iocp) and is at low level when no overcurrent is being detected (Io<Iocp). The overcurrent sense signal S71a is fed to the hiccup controller 71b and is also fed, as the overcurrent protection signal S71 described above, to the gate of the NMOSFET 35. Accordingly, the gate driving signal G1 is controlled in accordance with the overcurrent sense signal S71a (that is, the overcurrent protection signal S71); thus it is possible to limit the output current Io to equal to or lower than the overcurrent limit value Iocp.

The hiccup controller 71b generates a hiccup driving signal S71b based on both the overcurrent sense signal S71a and a temperature sense signal S71c, and thereby, on detection of an overcurrent (S71a=H), hiccup-drives (drives intermittently) the NMOSFET 10. The configuration and the operation of the hiccup controller 71b will be described in detail later.

The NOR gate 71c performs logical NOR operation between the first and second temperature sense signals S73a and S73b and thereby generates the temperature sense signal S71c to output it to the hiccup controller 71b.

The first temperature sense signal S73a is generated by detecting a temperature Tj (junction temperature) of the NMOSFET 10 by the temperature protection circuit 73 (in particular, the temperature detector 73a). The first temperature sense signal S73a is at high level when an overheating is being detected (Tj>Tth, where, for example, Tth=100° C.) and is at low level when no overcurrent is being detected (Tj<Tth).

The second temperature sense signal S73b is generated by detecting a difference in temperature ΔTj between the NMOSFET 10 and another element (such as a circuit element of the control logic circuit 40) by the temperature protection circuit 73 (in particular, the temperature difference detector 73b). The second temperature sense signal S73b is at high level when an overheating is being detected (ΔTj>ΔTth) and is at low level when no overcurrent is being detected (ΔTj<ΔTth).

Thus, when at least one of the first and second temperature sense signals S73a and S73b is at high level, the temperature sense signal S71c is at low level, and, when both the first and second temperature sense signals S73a and S73b are at low level, the temperature sense signal S71c is at high level.

When only one of the first and second temperature sense signals S73a and S73b is fed to the hiccup controller 71b, the NOR gate 71c may be omitted.

The drain of the NMOSFET 71d is connected to the gate of the NMOSFET 10. The gate and the source of the NMOSFET 71d are connected to the drain of the NMOSFET 71e. The NMOSFET 71d is of a depression type. Accordingly, the NMOSFET 71d thus connected functions as a constant current source.

The drain of the NMOSFET 71e is connected to the gate and the source of the NMOSFET 71d. The source of the NMOSFET 71e is connected to the grounded terminal. The gate of the NMOSFET 71e is connected to an application terminal for the hiccup driving signal S71b. Thus, the NMOSFET 71e is on when the hiccup driving signal S71b is at high level, and is off when the hiccup driving signal S71b is at low level.

When the NMOSFET 71e is on, the gate driving signal G1 is kept at low level(=GND), and thus the NMOSFET 10 is forcibly kept off. By contrast, when the NMOSFET 71e is off, the gate driving signal G1 is not pulled down to low level(=GND), and thus the NMOSFET 10 remains released from a forced off-state.

That is, the low-level period of the hiccup driving signal S71b corresponds to the on-period ton of the NMOSFET 10 during the hiccup operation, and the high-level period of the hiccup driving signal S71b corresponds to the off-period toff of the NMOSFET 10 during the hiccup operation.

Here, the hiccup controller 71b has a function of controlling at least one of the on-period ton and the off-period toff in accordance with the temperature sense signal S71c. A detailed description will be given below with reference to the relevant drawing.

<Hiccup Control>

Figure 7:
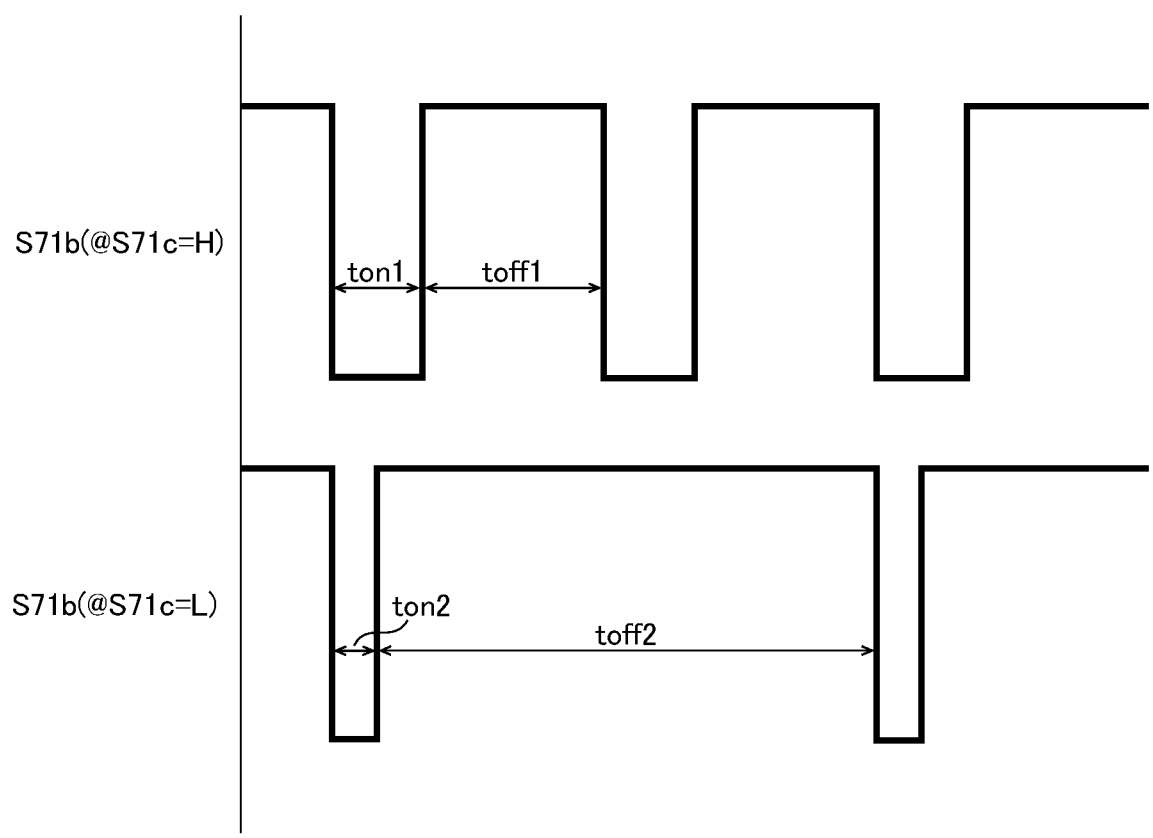
FIG. 7 is a diagram showing one example of hiccup control.

FIG. 7 is a diagram showing one example of hiccup control in the overcurrent protection circuit 71 (in particular, the hiccup controller 71b). The upper chart of FIG. 7 shows the behavior of the hiccup driving signal S71b when no abnormality is detected in the temperature Tj or in the difference in temperature ΔTj (S71c=H, for example, Tj=25° C.). On the other hand, the lower chart of FIG. 7 shows the behavior of the hiccup driving signal S71b when an abnormality is detected in the temperature Tj or in the difference in temperature ΔTj (S71c=L, for example, Tj=150° C.).

As shown in the upper chart of FIG. 7, in hiccup operation where no abnormality is detected in the temperature Tj or in the difference in temperature ΔTj (S71c=H), the low-level period of the hiccup driving signal S71b, that is, the on-period ton of the NMOSFET 10, is set to a first on-period ton1 (for example, 10 μs), and the high-level period of the hiccup driving signal S71b, that is, the off-period toff of the NMOSFET 10, is set to a first off-period toff1 (for example, 500 μs).

By contrast, as shown in the lower chart of FIG. 7, in hiccup operation where an abnormality is detected in the temperature Tj or in the difference in temperature ΔTj (S71c=L), the low-level period of the hiccup driving signal S71b, that is, the on-period ton of the NMOSFET 10, is set to a second on-period ton2 (for example, 5 μs), and the high-level period of the hiccup driving signal S71b, that is, the off-period toff of the NMOSFET 10 is set to a second off-period toff2 (for example, 1000 μs).

In this way, in hiccup operation where an abnormality is detected in the temperature Tj or in the difference in temperature ΔTj (S71c=L), the on-period ton is shortened and the off-period toff is lengthened. This helps reduce heat generation in the semiconductor integrated circuit device 1 (in particular, the NMOSFET 10); thus it is possible to improve safety during hiccup operation.

When the hiccup driving signal S71b is monitored periodically by the ECU 2, it is preferable that the on-period ton and the off-period toff be set as necessary such that the turning on/off of the NMOSFET 10 is repeated at a period shorter than the monitoring period.

<Hiccup Controller>

Figure 8:
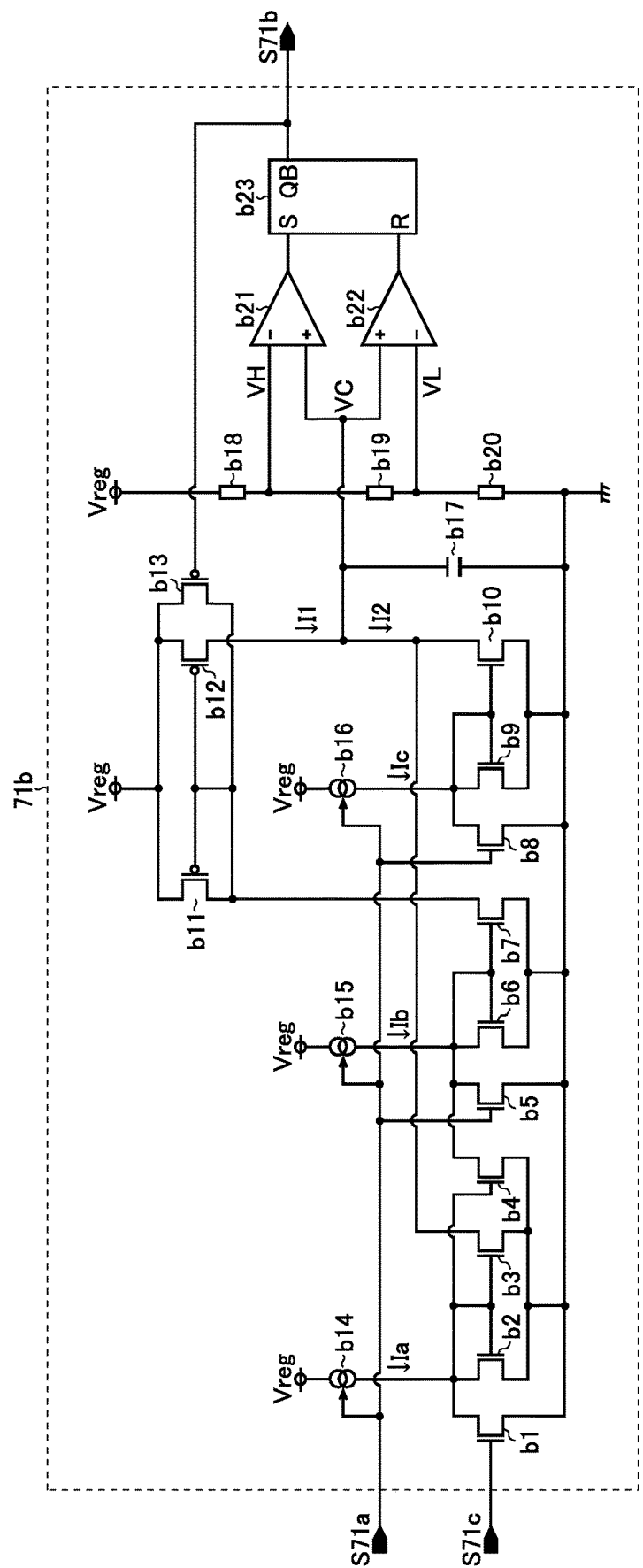
FIG. 8 is a diagram showing one configuration example of a hiccup controller.

FIG. 8 is a diagram showing one configuration example of the hiccup controller 71b. The hiccup controller 71b of this configuration example includes NMOSFETs b1 to b10, PMOSFETs b11 to b13, current sources b14 to b16, a capacitor b17, resistors b18 to b20, comparators b21 and b22, and an RS flip-flop b23.

The respective first terminals of the current sources b14 to b16 are all connected to an application terminal for the internal supply voltage Vreg. The respective control terminals of the current sources b14 to b16 are all connected to an application terminal for the overcurrent sense signal S71a. The current sources b14 to b16, when an overcurrent is being detected (S71a=H), generate currents Ia to Ic respectively and, when no overcurrent is being detected (S71a=L), keep from generating currents Ia to Ic.

The respective drains of the NMOSFETs b1 and b2 are both connected to the second terminal of the current source b14 (i.e., the output terminal for the current Ia). The gate of the NMOSFET b1 is connected to an application terminal for the temperature sense signal S71c. The respective gates of the NMOSFETs b2 to b4 are all connected to the drain of the NMOSFET b2. The respective sources of the NMOSFETs b1 to b4 are all connected to the grounded terminal.

The respective drains of the NMOSFETs b4 to b6 are all connected to the second terminal of the current source b15 (i.e., the output terminal for the current Ib). The gate of the NMOSFET b5 is connected to the application terminal for the overcurrent sense signal S71a. The respective gates of the NMOSFETs b6 and b7 are both connected to the drain of the NMOSFET b6. The respective sources of the NMOSFETs b5 to b7 are all connected to the grounded terminal.

The respective drains of the NMOSFETs b8 and b9 are both connected to the second terminal of the current source b16 (i.e., the output terminal for the current Ic). The gate of the NMOSFET b8 is connected to the application terminal for the overcurrent sense signal S71a. The respective gates of the NMOSFETs b9 and b10 are both connected to the drain of the NMOSFET b9. The respective sources of the NMOSFETs b8 to b10 are all connected to the grounded terminal.

The respective sources of the PMOSFETs b11 to b13 are all connected to the application terminal for the internal supply voltage Vreg. The respective gates of the PMOSFETs b11 and b12 and the drain of the PMOSFET b13 are all connected to the drain of the PMOSFET b11. The drain of the PMOSFET b11 is connected to the drain of the NMOSFET b7. The gate of the PMOSFET b13 is connected to the output terminal of the RS flip-flop b23 (i.e., application terminal for the hiccup driving signal S71b).

Of the circuit elements described above, the current sources b14 and b15, the NMOSFETs b1 and b2, the NMOSFETs b4 to b7, as well as the PMOSFETs b11 to b13 function as a charge current generator that generates a charge current T1 for the capacitor b17.

Of the circuit elements described above, the current sources b14 and b16, the NMOSFETs b1 to b3, and the NMOSFETs b8 to b10 function as a discharge current generator that generates a discharge current I2(<T1) for the capacitor b17.

The first terminal of the capacitor b17 is connected to the drain of the PMOSFET b12 and to the respective drains of the NMOSFETs b3 and b10. The second terminal of the capacitor b17 is connected to the grounded terminal.

The first terminal of the resistor b18 is connected to the application terminal for the internal supply voltage Vreg. The second terminal of the resistor b18 and the first terminal of the resistor b19 are both connected to an application terminal for a threshold voltage VH. The second terminal of the resistor b19 and the first terminal of the resistor b20 are both connected to an application terminal for a threshold voltage VL(<VH). The second terminal of the resistor b20 is connected to the grounded terminal.

The comparator b21 compares the threshold voltage VH, which is fed to the inverting input terminal (−) of the comparator b21, with a charge voltage VC across the capacitor b17, which is fed to the non-inverting input terminal (+) of the comparator b21, to generate a set signal S (corresponding to a first comparison signal) for the RS flip-flop b23. The set signal S is at high level when VC>VH and is at low level when VC<VH.

The comparator b22 compares the threshold voltage VL, which is fed to the inverting input terminal (−) of the comparator b22, with the charge voltage VC across the capacitor b17, which is fed to the non-inverting input terminal (+) of the comparator b22, to generate a reset signal R (corresponding to a second comparison signal) for the RS flip-flop b23. The reset signal R is at high level when VC>VL and is at low level when VC<VL.

The RS flip-flop b23, in accordance with the set signal S fed to its set terminal (S) and the reset signal R fed to its reset terminal (R), outputs the hiccup driving signal S71b from its inverting output terminal (QB). The hiccup driving signal S71b is set to low level when the set signal S rises to high level, and is reset to high level when the reset signal R falls to low level.

In the hiccup controller 71b configured as described above, when no overcurrent is detected (S71a=L), neither the charge current I1 nor the discharge current I2 for the capacitor b17 is generated. Here, the hiccup driving signal S71b is fixed at low level, and the NMOSFET 71e is kept off. This corresponds to a state where the NMOSFET 10 remains released from a forced off-state, that is, a state where hiccup operation is not being performed.

By contrast, when an overcurrent is detected (S71a=H), both the charge current I1 and the discharge current I2 for the capacitor b17 are generated.

Suppose here that, for example, the hiccup driving signal S71b is at high level. In this case, the PMOSFET b13 is off, and a current mirror formed by the PMOSFETs b11 and b12 is enabled; thus the charge current I1 is fed into the capacitor b17. By contrast, the discharge current I2 is, regardless of the logic level of the hiccup driving signal S71b, constantly drawn out of the capacitor b17. Thus, the capacitor b17 is charged by a differential current(=I1−I2) given by subtracting the discharge current I2 from the charge current I1. As a result, the charge voltage VC increases with a gradient reflecting the differential current(=I1−I2).

When the charge voltage VC becomes higher than the threshold voltage VH, the hiccup driving signal S71b is set to low level and the PMOSFET b13 is turned on; thus, the current mirror formed by the PMOSFETs b11 and b12 is disabled. Thus, the charge current I1 stops being supplied to the capacitor b17, and the capacitor b17 is discharged with the discharge current I2. As a result, the charge voltage VC falls with a gradient reflecting the discharge current I2.

When the charge voltage VC becomes lower than the threshold voltage VH, the hiccup driving signal S71b is reset to high level and the PMOSFET b13 is turned back off. Accordingly, charging of the capacitor b17 with the differential current(=I1−I2) described above is restarted.

Thereafter, similar operation is repeated so that the hiccup driving signal S71b is pulse-driven periodically.

While the charge voltage VC falls from the threshold voltage VH down to the threshold voltage VL, the hiccup driving signal S71b remains at low level and the NMOSFET 10 remains released from a forced off-state. That is, the discharge period of the capacitor b17 corresponds to the on-period ton of the NMOSFET 10 in hiccup operation.

By contrast, while the charge voltage VC rises from the threshold voltage VL to the threshold voltage VH, the hiccup driving signal S71b remains at high level, and the NMOSFET 10 remains forcibly turned off. That is, the charge period of the capacitor b17 corresponds to the off-period toff of the NMOSFET 10 in hiccup operation.

Incidentally, the charge current I1 and the discharge current I2 described above are each switched to different current values in accordance with the logic level of the temperature sense signal S71c.

First, consider a case where no abnormality is detected in the temperature Tj or in the difference in temperature ΔTj (S71c=H). In this case, the NMOSFET b1 is on and the current mirror formed by the NMOSFETs b2 to b4 is disabled. As a result, the current Ib acts as the charge current I1 and the current Ic acts as the discharge current I2. Accordingly, the charge voltage VC rises with a gradient reflecting a differential current(=Ib−Ic) given by subtracting the discharge current I2(=Ic) from the charge current T1(=Ib) and falls with a gradient reflecting the discharge current I2(=Ic).

Next, consider a case where an abnormality is detected in the temperature Tj or in the difference in temperature ΔTj (S71c=L). In this case, the NMOSFET b1 is off and the current mirror formed by the NMOSFETs b2 to b4 is enabled. As a result, the differential current(=Ib−Ia) given by subtracting the current Ia from the current Ib acts as the charge current I1, and the sum current given by adding the currents Ic and Ia together(=Ic+Ia) acts as the discharge current I2. Accordingly, the charge voltage VC rises with a gradient reflecting a differential current(=Ib−Ic−2×Ia) given by subtracting the discharge current I2(=Ic+Ia) from the charge current T1(=Ib−Ia) and falls with a gradient reflecting the discharge current I2(=Ic+Ia).

In this way, the hiccup controller 71b, when an abnormality is detected in the temperature Tj or in the difference in temperature ΔTj (S71c=L), reduces the charge current T1 and increases the discharge current I2. As a result, the discharge period of the capacitor b17 (that is, the on-period ton) is shortened and the charge period of the capacitor b17 (that is, the off-period toff) is lengthened. It is thus possible to reduce heat generation in the semiconductor integrated circuit device 1 (in particular, in the NMOSFET 10).

Figure 9:
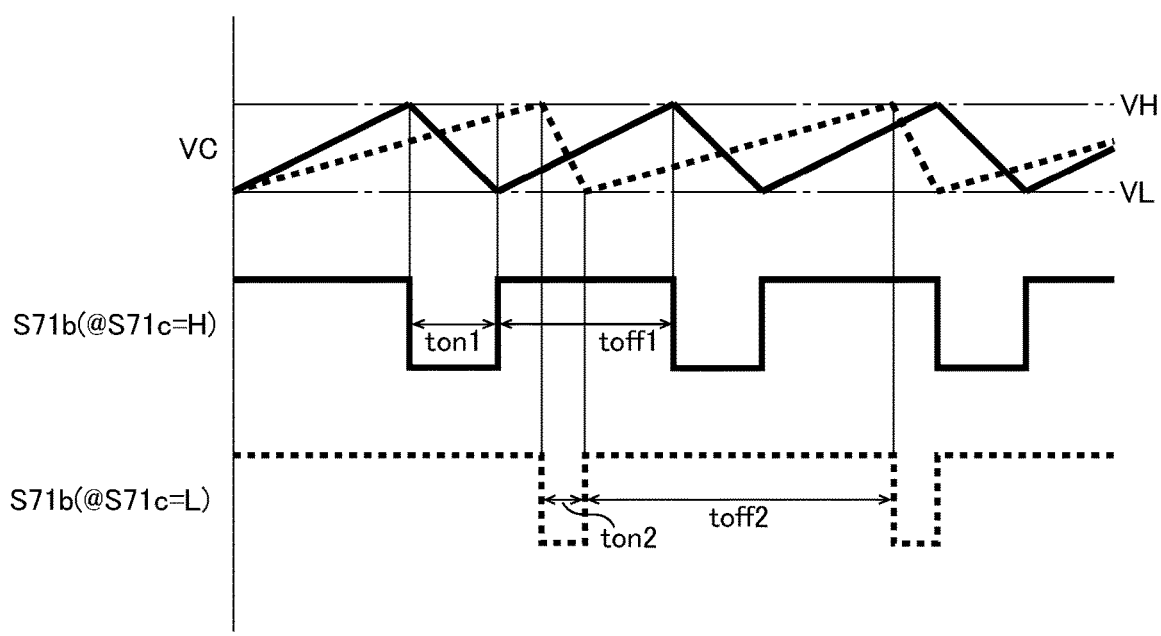
FIG. 9 is a diagram showing the behavior of a charge voltage and a hiccup driving signal.

FIG. 9 is a diagram showing the behavior of the charge voltage VC and the hiccup driving signal S71b. In the diagram, solid lines indicate the behavior observed when no abnormality is detected in the temperature Tj or in the difference in temperature ΔTj (S71c=H, for example, Tj=25° C.), and broken lines indicate the behavior observed when an abnormality is detected in the temperature Tj or in the difference in temperature ΔTj (S71c=L, for example, Tj=150° C.).

First, with reference to the solid lines, the behavior observed when no abnormality is detected in the temperature Tj or in the difference in temperature ΔTj (S71c=H) will be described in detail. In this case, the charge voltage VC rises with a gradient reflecting the differential current(=Ib−Ic) given by subtracting the discharge current I2(=Ic) from the charge current T1(=Ib) and falls with a gradient reflecting the discharge current I2(=Ic).

Here, the on-period ton of the NMOSFET 10 is set to the first on-period ton1(=[(VH−VL)/Ic]×C, where C is the capacitance value of the capacitor b17). On the other hand, the off-period toff is set to the first off-period toff1 ([(VH−VL)/(Ib−Ic)]×C).

Next, with reference to the broken lines, the behavior observed when an abnormality is detected in the temperature Tj or in the difference in temperature ΔTj (S71c=L) will be described in detail. In this case, compared to the case described above where no abnormality is detected (S71c=H), the charge voltage VC rises more gently with a gradient reflecting a differential current(=Ib−Ic−2×Ia) given by subtracting the discharge current I2(=Ic+Ia) from the charge current I1(=Ib−Ia) and falls more sharply with a gradient reflecting the discharge current I2(=Ic+Ia).

Here, the on-period ton of the NMOSFET 10 is set to the second on-period ton2(=[(VH−VL)/(Ic+Ia)]×C) shorter than the first on-period ton1. On the other hand, the off-period toff is set to the second off-period toff2 ([(VH−VL)/(Ib−Ic−2×Ia)]×C) longer than the first off-period toff1.

That is, in a case where an abnormality is detected in the temperature Tj or in the difference in temperature ΔTj (S71c=L), the NMOSFET 10 has a shortened on-period ton and a lengthened off-period toff. It is thus possible to reduce heat generation in the semiconductor integrated circuit device 1 (in particular, in the NMOSFET 10).

<Hiccup Control (Modified Example)>

Although the above embodiment deals with an example where the on-period ton and the off-period toff are adjusted in accordance with the result of comparison of the temperature Tj (or the difference in temperature ΔTj) with a single threshold value Tth (threshold value ΔTth), the method for hiccup control is not limited to this.

Figure 10:
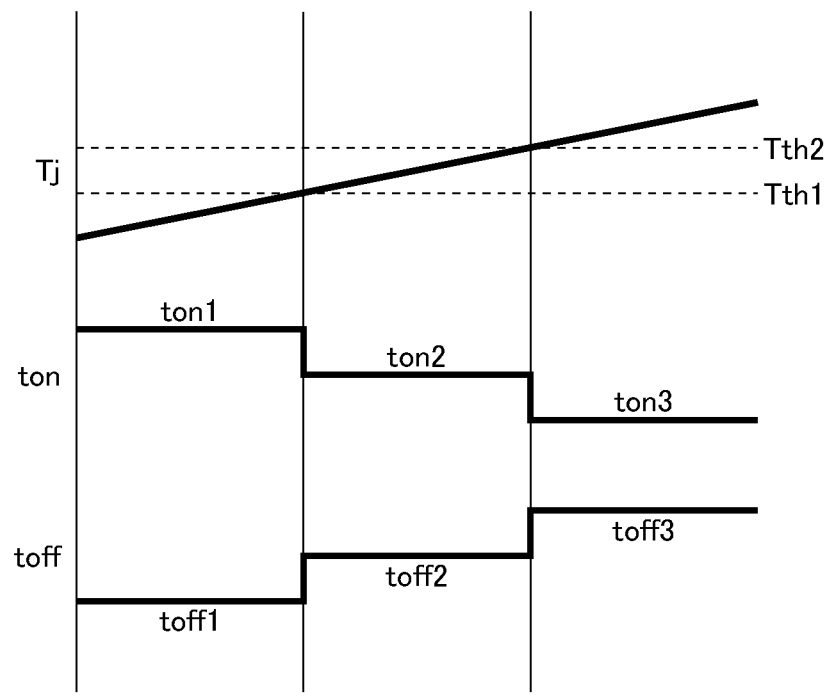
FIG. 10 is a diagram showing a first modified example of hiccup control.

FIG. 10 is a diagram showing a first modified example of hiccup control. In this modified example, when Tj<Tth1, the on-period ton is set to the first on-period ton1 and the off-period toff is set to the first off-period toff1. By contrast, when Tth1<Tj<Tth2, the on-period ton is set to the second on-period ton2(<ton1) and the off-period toff is set to the second off-period toff2(>toff1). By further contrast, when Tj>Tth2, the on-period ton is set to a third on-period ton3(<ton2) and the off-period toff is set to a third off-period toff3(>toff2).

In this way, it is possible to use a plurality of threshold values Tth1 and Tth2 so that the on-period ton and the off-period toff are switched in multiple steps.

Figure 11:
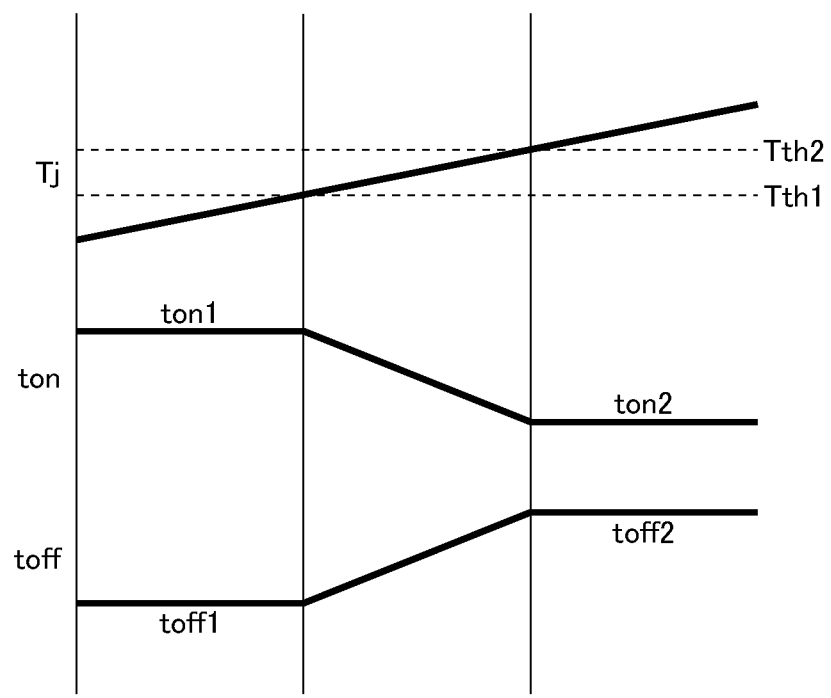
FIG. 11 is a diagram showing a second modified example of hiccup control.

FIG. 11 is a diagram showing a second modified example of hiccup control. In this modified example, when Tj<Tth1, the on-period ton is set to the first on-period ton1 and the off-period toff is set to the first off-period toff1. By contrast, when Tth1<Tj<Tth2, the higher the temperature Tj, the shorter the on-period ton and the longer the off-period toff. By further contrast, when Tj>Tth2, the on-period ton is set to the second on-period ton2(<ton1) and the off-period toff is set to the second off-period toff2(>toff1).

It is possible to use a plurality of threshold values Tth1 and Tth2 with continuous transition temperature regions provided respectively between the first and second on periods ton1 and ton2 and between the first and second off periods toff1 and toff2.

<IC Layout>

Figure 12:
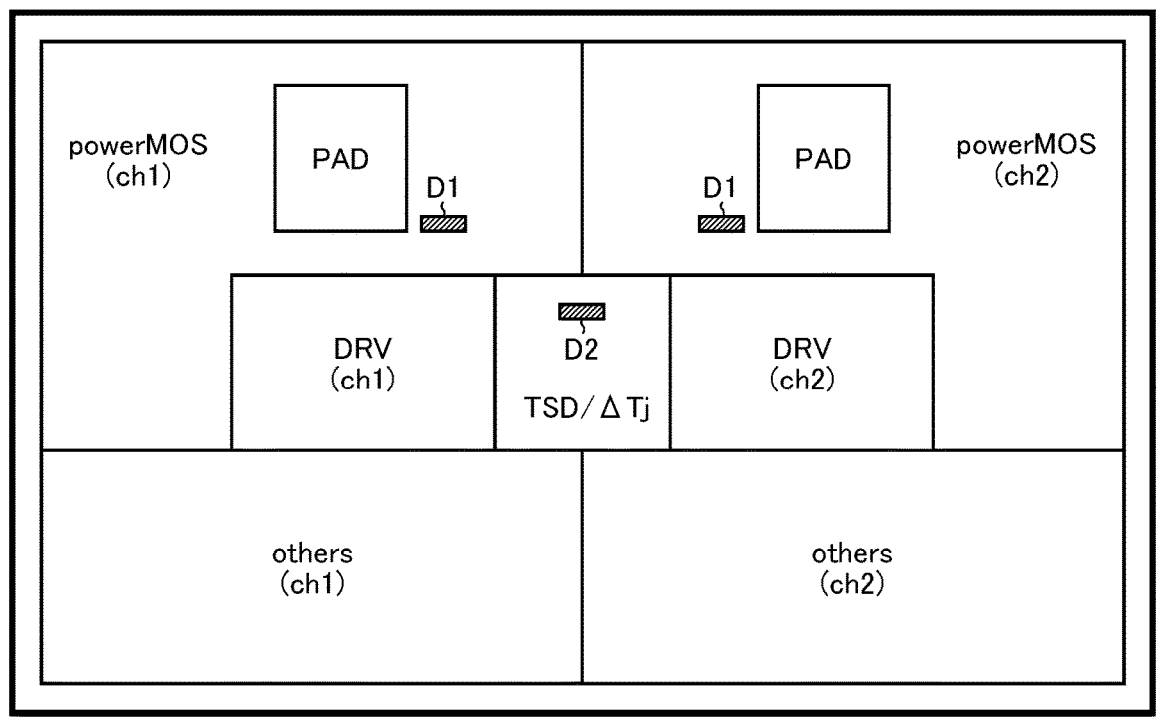
FIG. 12 shows the layout of the semiconductor integrated circuit device.

FIG. 12 shows the layout of the semiconductor integrated circuit device 1 adapted for two channels. As shown in FIG. 12, a power MOSFET for each channel (corresponding to the NMOSFET 10 in FIG. 1) is arranged in a side-edge part of a chip instead of in a central part. The power MOSFET for each channel is formed in an L shape as seen in a plan view. This is a common shape for enhancing tolerance to an inductive load such as an inductor.

In a central part of the chip, a driver DRV (corresponding to the gate controller 30 in FIG. 1) and a temperature protection circuit TSD/ΔTj (corresponding to the temperature protection circuit 73 in FIG. 1) for each channel are formed so as to be surrounded by the power MOSFET and other circuit elements for that channel.

It is preferable to arrange a temperature detection element D1 that detects the temperature Tj1 of a power MOSFET at a place where heat tends to concentrate most within the region where the power MOSFET is formed. Such a place may seem to be in a central part of the power MOSFET;

actually, however, the place where heat tends to concentrate most is determined depending on the arrangement of the pad, the area of the power MOSFET, and the like. In FIG. 12, where power MOSFETs are provided in two channels, with consideration given to left-right symmetry and ease of laying conductors as laid out, the temperature detection elements D1 is provided near the pad of the power MOSFET (in particular, of the four corners of the pad, near the corner closest to the temperature protection circuit TSD/ΔTj), and the position of the pad is adjusted such that heat concentrates most at the above-mentioned place.

A temperature detection element D2 that detects the temperature Tj2 of the part of the integrated circuit other than the power MOSFET does not need to be arranged unnecessarily far from the power MOSFETs. It is preferable to arrange the temperature detection element D2 near the power MOSFET with consideration given to detection accuracy. In the illustrated example, the temperature detection element D2 is arranged within the region where the temperature protection circuit TSD/ΔTj adjacent to the power MOSFET is formed. The temperature Tj1 of the power MOSFET (that is, the detection signal of the temperature detection element D1) rises sharply when the power MOSFET turns on and the current passes, and falls when the power MOSFET turns off. On the other hand, the temperature Tj2 (that is, the detection signal from the temperature detection element D2) of the temperature protection circuit TSD/ΔTj changes gradually as the power MOSFET produces heat.

The temperature protection circuit TSD/ΔTj has not only a function block (corresponding to the temperature detector 73a in FIG. 6) that monitors the temperature Tj1 of the power MOSFET but also a function block (the temperature difference detector 73b in FIG. 6) that monitors the difference in temperature ΔTj(=Tj1−Tj2) between the power MOSFET and the other part of the integrated circuit.

<Application to Vehicles>

Figure 13:
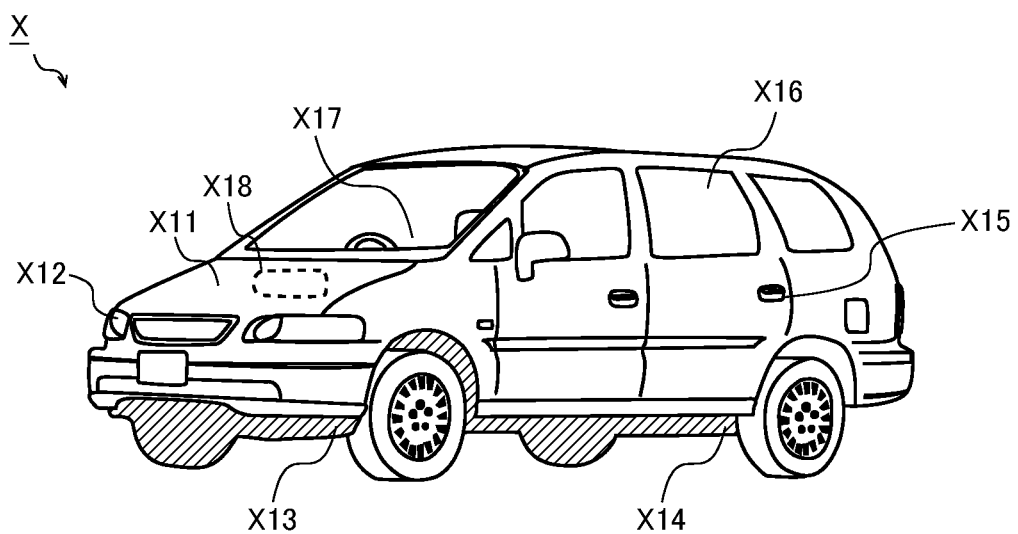
FIG. 13 is an exterior view of a vehicle.

FIG. 13 is an exterior view showing one configuration example of a vehicle. The vehicle X of this configuration example incorporates a battery (unillustrated in FIG. 13) and various electronic appliances X11 to X18 that operate by being supplied with electric power from the battery. It should be noted that, for the sake of convenient illustration, the electronic appliances X11 to X18 may actually be arranged elsewhere than they are shown to be arranged in FIG. 13.

The electronic appliance X11 is an engine control unit which performs control with respect to an engine (injection control, electronic throttle control, idling control, oxygen sensor heater control, automatic cruise control, etc.).

The electronic appliance X12 is a lamp control unit that controls the turning on and off of HIDs (high intensity discharged lamps), DRLs (daytime running lamps), and the like.

The electronic appliance X13 is a transmission control unit which performs control with respect to a transmission.

The electronic appliance X14 is a body control unit that performs control with respect to the movement of the vehicle X (such as the control of an ABS (anti-lock brake system), EPS (electric power steering), and electronic suspension).

The electronic appliance X15 is a security control unit which drives and controls door locks, burglar alarms, and the like.

The electronic appliance X16 comprises electronic appliances incorporated in the vehicle X as standard or manufacturer-fitted equipment at the stage of factory shipment, such as wipers, power side mirrors, power windows, dampers (shock absorbers), a power sun roof, and power seats.

The electronic appliance X17 comprises electronic appliances fitted to the vehicle X optionally as user-fitted equipment, such as vehicle mounted AV (audio-visual) equipment, a car navigation system, and an ETC (electronic toll collection system).

The electronic appliance X18 comprises electronic appliances provided with high-withstand-voltage motors, such as a vehicle-mounted blower, an oil pump, a water pump, and a battery cooling fan.

The semiconductor integrated circuit device 1, the ECU 2, and the load 3 described above can be incorporated into any of the electronic appliances X11 to X18.

Overview

To follow is an overview of the various embodiments described thus far.

According to one aspect of what is disclosed herein, an overcurrent protection circuit includes a hiccup controller configured to, when an output current that passes through a switching element goes into an overcurrent state, hiccup-drive the switching element such that a predetermined on-period and a predetermined off-period alternate. The hiccup controller is configured to control at least one of the on-period and the off-period in accordance with a temperature sense signal (a first configuration).

In the overcurrent protection circuit according to the first configuration described above, preferably, the temperature sense signal is generated by detecting at least one of the temperature of the switching element and the difference in temperature between the switching element and another element (a second configuration).

In the overcurrent protection circuit according to the second configuration described above, preferably, the hiccup controller is configured to, when at least one of the temperature and the difference in temperature is higher than a predetermined threshold value, either shorten the on-period or lengthen the off-period (a third configuration).

In the overcurrent protection circuit according to any of the first to third configurations described above, preferably, the hiccup controller includes a capacitor, a charge current generator configured to generate a charge current for the capacitor, a discharge current generator configured to generate a discharge current for the capacitor, a first comparator configured to compare a charge voltage for the capacitor with a first threshold voltage to generate a first comparison signal, a second comparator configured to compare the charge voltage with a second threshold voltage to generate a second comparison signal, and a flip-flop configured to generate a hiccup driving signal for the switching element in accordance with the first and second comparison signals (a fourth configuration).

In the overcurrent protection circuit according to the fourth configuration described above, preferably, the hiccup controller is configured to, when at least one of temperature of the switching element and the difference in temperature between the switching element and another element is higher than a predetermined threshold value, change at least one of the charge current and the discharge current (a fifth configuration).

The overcurrent protection circuit according to any of the first to fifth configurations described above, preferably, further includes an overcurrent sensor configured to limit the output current to equal to or lower than a predetermined overcurrent limit value (a sixth configuration).

According to another aspect of what is disclosed herein, a switching device includes a switching element and the overcurrent protection circuit according to any of the first to sixth configurations described above (a seventh configuration).

According to yet another aspect of what is disclosed herein, an electronic appliance includes the switching device according to the seventh configuration described above and a load connected to the switching device (an eighth configuration).

In the electronic appliance according to the eighth configuration, preferably, the load is a bulb lamp, a relay coil, a solenoid, a light emitting diode, or a motor (a ninth configuration).

According to still another aspect of what is disclosed herein, a vehicle includes the electronic appliance according to the eighth or ninth configuration (a tenth configuration).

<Further Modifications>

Although the embodiments described above deal with a vehicle-mounted high-side switch LSI as an example, the application of the invention disclosed herein is not limited to this. It can be widely applied, for example, not only to any other vehicle-mounted IPDs (such as vehicle-mounted LSIs), but also to any semiconductor integrated circuit devices (such as general power supply control circuits) other than for vehicles.

The various technical features disclosed herein may be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

INDUSTRIAL APPLICABILITY

The invention disclosed herein finds application in vehicle-mounted IPDs and the like.

LIST OF REFERENCE SIGNS 1 semiconductor integrated circuit device (switching device)
2 ECU
3 load
4 external sense resistor
10 NMOSFET (switching element)
20 output current monitor
21, 22 NMOSFET
23 sense resistor
30 gate controller
31 gate driver
32 oscillator
33 charge pump (voltage booster)
34 clamper
35 NMOSFET
36 resistor
37 capacitor
38 Zener diode (clamping element)
40 control logic circuit
50 signal input circuit
60 internal power source
70 fault protector
71 overcurrent protection circuit
71a overcurrent sensor
71b hiccup controller
71c NOR gate
71d, 71e NMOSFET
72 open protection circuit
73 temperature protection circuit
73a temperature detector
73b temperature difference detector
74 undervoltage protection circuit
80 output current detector
90 signal output circuit
b1 to b10 NMOSFET
b11 to b13 PMOSFET
b14 to b16 current source
b17 capacitor
b18 to b20 resistor
b21, b22 comparator
b23 RS flip-flop
D1, D2 temperature detection element
T1 to T4 external terminal
X vehicle
X11 to X18 electronic appliances

The invention claimed is:

1. An overcurrent protection circuit comprising:
a hiccup controller configured to, when an output current that passes through a switching element goes into an overcurrent state, drive the switching element in a hiccup fashion such that a predetermined on-period and a predetermined off-period alternate,
wherein the hiccup controller is configured to receive a temperature sense signal,
wherein the hiccup controller is configured to control at least one of the on-period and the off-period in accordance with the temperature sense signal, the temperature sense signal being representative of at least one of a temperature of the switching element and a difference in temperature between the switching element and an additional element,
wherein the hiccup controller is configured
  to set the on-period to a first on-period and the off-period to a first off-period in a first temperature region when the temperature of the switching element or the difference in temperature between the switching element and the additional element is below a first threshold,
  to set the on-period to a second on-period shorter than the first on-period and set the off-period to a second off-period longer than the first off-period in a second temperature region when the temperature of the switching element or the difference in temperature between the switching element and the additional element is above a second threshold higher than the first threshold, and
  to continuously shorten the on-period from the first on-period to the second on-period and continuously extend the off-period from the first off-period to the second off-period as the temperature of the switching element increases or as the difference in temperature between the switching element and the additional element increases in a third temperature region when the temperature of the switching element or the difference in temperature between the switching element and the additional element is above the first threshold and below the second threshold.

2. The overcurrent protection circuit according to claim 1, wherein the hiccup controller includes:

a capacitor, a charge current generator configured to generate a charge current for the capacitor, a discharge current generator configured to generate a discharge current for the capacitor, a first comparator configured to compare a charge voltage for the capacitor with a first threshold voltage to generate a first comparison signal, a second comparator configured to compare the charge voltage with a second threshold voltage to generate a second comparison signal, and a flip-flop configured to generate a hiccup driving signal for the switching element in accordance with the first and second comparison signals.

3. The overcurrent protection circuit according to claim 2, wherein the hiccup controller is configured to, when at least one of the temperature of the switching element and the difference in temperature between the switching element and the additional element is higher than a predetermined threshold value, change at least one of the charge current and the discharge current.

4. The overcurrent protection circuit according to claim 1, further comprising an overcurrent sensor configured to limit the output current to equal to or lower than a predetermined overcurrent limit value.

5. A switching device comprising:
a switching element; and
the overcurrent protection circuit according to claim 1.

6. An electronic appliance comprising:
the switching device according to claim 5; and
a load connected to the switching device.

7. The electronic appliance according to claim 6, wherein the load is a bulb lamp, a relay coil, a solenoid, a light emitting diode, or a motor.

8. A vehicle comprising the electronic appliance according to claim 6.

* * * * *